US012590372B2

(12) United States Patent
Zergioti et al.

(10) Patent No.: US 12,590,372 B2
(45) Date of Patent: Mar. 31, 2026

(54) LASER INDUCED FORWARD TRANSFER OF 2D MATERIALS

(71) Applicants: National Technical University of Athens, Athina (GR); Ioanna Zergioti, Athens (GR); Bar-Ilan University, Ramat-Gan (IL); Graphenea Semiconductor S.L.U., Donostia (ES)

(72) Inventors: Ioanna Zergioti, Athens (GR); Symeon Papazoglou, Athens (GR); Filimon Zacharatos, Athens (GR); Adamantia Logotheti, Athens (GR); Amaia Pesquera, Donostia-San Sebastian (ES); Amaia Zurutuza, Donostia-San Sebastian (ES); Doron Naveh, Petach Tikva (IL)

(73) Assignees: Ioanna Zergioti, Athens (GR); National Technical University of Athens, Athina (GR); Bar-Ilan University, Ramat-gan (IL); Graphenea Semiconductor S.L.U., Donostia (ES)

( * ) Notice: Subject to any disclaimer, the term of this patent is extended or adjusted under 35 U.S.C. 154(b) by 0 days.

(21) Appl. No.: 17/725,365

(22) Filed: Apr. 20, 2022

(65) Prior Publication Data

US 2022/0380901 A1 Dec. 1, 2022

Related U.S. Application Data

(60) Provisional application No. 63/193,968, filed on May 27, 2021.

(51) Int. Cl.
*C23C 16/48* (2006.01)
*C01B 19/00* (2006.01)
(Continued)

(52) U.S. Cl.
CPC .......... *C23C 16/483* (2013.01); *C01B 19/002* (2013.01); *C01B 21/0648* (2013.01);
(Continued)

(58) Field of Classification Search
CPC ..... B23K 26/57; C23C 14/0623; C23C 14/04; C23C 16/483
See application file for complete search history.

(56) References Cited

U.S. PATENT DOCUMENTS

2013/0036928 A1* 2/2013 Rogers .................... B41J 2/475
101/483
2020/0066998 A1* 2/2020 Morse .................. H10K 85/655

FOREIGN PATENT DOCUMENTS

WO 2007/015465 * 8/2007
WO 2018/140145 * 2/2018
(Continued)

OTHER PUBLICATIONS

Edsger C. P. Smits et al, Applied Physics Letters 111, (2017) 173101-1 to 173101-4. (Year: 2014).*
(Continued)

*Primary Examiner* — Tabassom Tadayyon Eslami
(74) *Attorney, Agent, or Firm* — Suiter Swantz IP

(57) ABSTRACT

A system and method for performing is laser induced forward transfer (LIFT) of 2D materials is disclosed. The method includes generating a receiver substrate, generating a donor substrate, wherein the donor substrate comprises a back surface and a front surface, applying a coating to the front surface, wherein the coating includes donor material, aligning the front surface of the donor substrate to be parallel to and facing the receiver substrate, wherein the donor material is disposed adjacent to the target layer, and irradiating the coating through the back surface of the donor substrate with one or more laser pulses produced by a laser
(Continued)

100 to transfer a portion of the donor material to the target layer. The donor material may include $Bi_2Se_{(3-x)}S_x$, $MOS_2$, hexagonal boron nitride (h-BN) or graphene. The method may be used to create touch sensors and other electronic components.

10 Claims, 13 Drawing Sheets

(51) Int. Cl.

| | |
|---|---|
| *C01B 21/064* | (2006.01) |
| *C01B 32/186* | (2017.01) |
| *C01B 32/194* | (2017.01) |
| *C01G 39/06* | (2006.01) |
| *C09D 11/037* | (2014.01) |
| *C09D 11/52* | (2014.01) |
| *C23C 14/06* | (2006.01) |
| *C23C 16/56* | (2006.01) |
| *G01D 5/24* | (2006.01) |
| *H01L 21/02* | (2006.01) |
| *H10D 30/67* | (2025.01) |
| *H10D 62/80* | (2025.01) |
| *H10D 62/82* | (2025.01) |

(52) U.S. Cl.
CPC .......... *C01B 32/186* (2017.08); *C01B 32/194* (2017.08); *C01G 39/06* (2013.01); *C09D 11/037* (2013.01); *C09D 11/52* (2013.01); *C23C 14/0605* (2013.01); *C23C 14/0647* (2013.01); *C23C 16/56* (2013.01); *G01D 5/2405* (2013.01); *H01L 21/02568* (2013.01); *H01L 21/02617* (2013.01); *H10D 30/67* (2025.01); *C01P 2002/76* (2013.01); *C01P 2006/40* (2013.01); *H10D 62/80* (2025.01); *H10D 62/82* (2025.01); *H10D 62/882* (2025.01)

(56) References Cited

FOREIGN PATENT DOCUMENTS

| | | | |
|---|---|---|---|
| WO | 2019/129349 | * | 4/2019 |
| WO | 2019/236616 | * | 12/2019 |

OTHER PUBLICATIONS

Pere Serra et al, Adv. Mater. Technol. 2019, 4, 1800099-1 to 1800099-33. (Year: 2018).*

Mengwei Li et al, Applied Physics Letters 112, (2018) 14502-1 to 14502-4 (Year: 2018).*

Matthew Praeger et al, Applied Surface Science 533(2020)147488 (Year: 2020).*

James Shaw-Stewart et al, Appl Phys A (2011) 105:713722 (Year: 2011).*

* cited by examiner

100

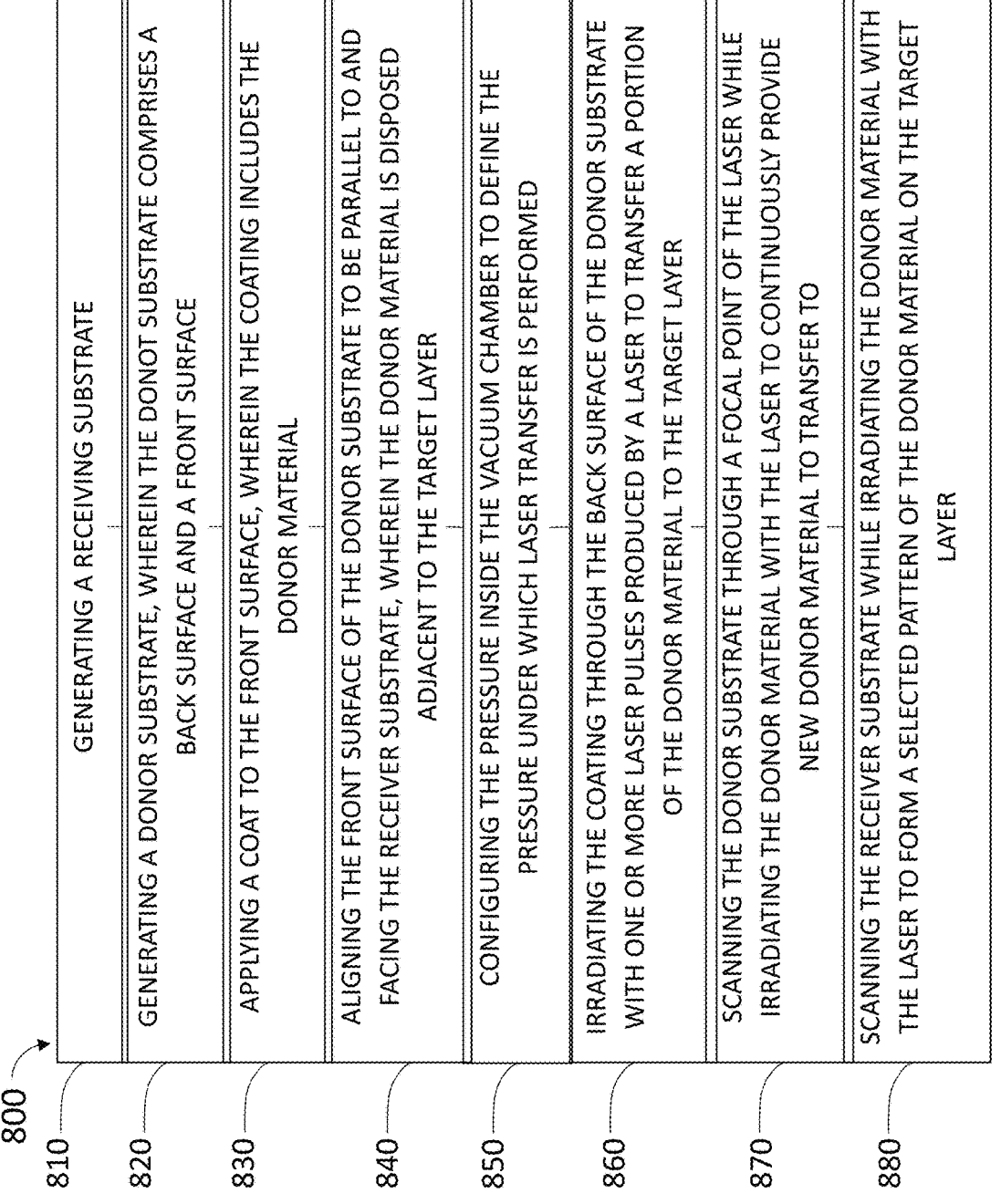

800

810 — GENERATING A RECEIVING SUBSTRATE

820 — GENERATING A DONOR SUBSTRATE, WHEREIN THE DONOT SUBSTRATE COMPRISES A BACK SURFACE AND A FRONT SURFACE

830 — APPLYING A COAT TO THE FRONT SURFACE, WHEREIN THE COATING INCLUDES THE DONOR MATERIAL

840 — ALIGNING THE FRONT SURFACE OF THE DONOR SUBSTRATE TO BE PARALLEL TO AND FACING THE RECEIVER SUBSTRATE, WHEREIN THE DONOR MATERIAL IS DISPOSED ADJACENT TO THE TARGET LAYER

850 — CONFIGURING THE PRESSURE INSIDE THE VACUUM CHAMBER TO DEFINE THE PRESSURE UNDER WHICH LASER TRANSFER IS PERFORMED

860 — IRRADIATING THE COATING THROUGH THE BACK SURFACE OF THE DONOR SUBSTRATE WITH ONE OR MORE LASER PULSES PRODUCED BY A LASER TO TRANSFER A PORTION OF THE DONOR MATERIAL TO THE TARGET LAYER

870 — SCANNING THE DONOR SUBSTRATE THROUGH A FOCAL POINT OF THE LASER WHILE IRRADIATING THE DONOR MATERIAL WITH THE LASER TO CONTINUOUSLY PROVIDE NEW DONOR MATERIAL TO TRANSFER TO

880 — SCANNING THE RECEIVER SUBSTRATE WHILE IRRADIATING THE DONOR MATERIAL WITH THE LASER TO FORM A SELECTED PATTERN OF THE DONOR MATERIAL ON THE TARGET LAYER

FIG.8

LASER INDUCED FORWARD TRANSFER OF 2D MATERIALS

CROSS-REFERENCE TO RELATED APPLICATION

The present application claims the benefit under 35 U.S.C. § 119(e) of U.S. Provisional Application Ser. No. 63/193,968 filed May 27, 2021 which is incorporated herein by reference in the entirety.

TECHNICAL FIELD

The present invention generally relates to the fields of coating technologies, and, more particularly, to a system and method for printing of 2D materials.

BACKGROUND

The deposition of two-dimensional (2D) materials on electronics and electronic componentry typically involves multiple time-consuming processing steps which increase device fabrication complexity and the risk of impurity contamination. For example, chemical vapor deposition (CVB) involves multiple processes, each carrying a risk for unwanted modification, or even destruction, of the printed specimen. Wet-transfer/deposition methods also involve steps that risk the destruction of the substrate, as a chemical solution is required to remove temporary support layer and etch a supporting metal foil (e.g., Cu, Ni), during transfer of 2D materials to the substrate, followed by the removal of any solvent residues through high-temperature annealing.

Solvent-free dry-transfer approaches also include risky steps, including the complete removal of any polymer stamps which may be used to facilitate the transfer of the 2D material, or the control of damage caused by the physical delamination of the 2D material when it is peeled off a metal substrate. Furthermore, even if a relatively clean transfer is achieved by any means, the design of advanced printed electronics with high level of architectural complexity and functionality poses yet another challenge of obtaining well-defined and site-specific transferred patterns. For this matter, photolithography can provide good control over printed features. However, photolithography also increases the cost of the overall fabrication and the likelihood of impurity insertion during the removal of polymer photoresists. Therefore, it is desirable to provide a system or method that avoids the shortcomings of conventional approaches.

SUMMARY

A method is disclosed. In some embodiments, the method includes generating a receiver substrate. In some embodiments, the method further includes generating a donor substrate, wherein the donor substrate comprises a back surface and a front surface. In some embodiments, the method further includes applying a coating to the front surface, wherein the coating includes donor material. In some embodiments, the method further includes aligning the front surface of the donor substrate to be parallel to and facing the receiver substrate, wherein the donor material is disposed adjacent to the target layer. In some embodiments, the method further includes regulating the pressure inside the vacuum chamber under which the transfer is performed to values ranging between atmospheric pressure (1000 mbar) and reduced pressure down to $10^{-2}$ mbar. In some embodiments, the method further includes irradiating the coating through the back surface of the donor substrate with one or more laser pulses produced by the laser to transfer a portion of the donor material to the target layer.

In some embodiments of the method, the method further includes scanning the donor substrate through a focal point of the laser while irradiating the donor material with the laser to continuously provide new donor material to transfer to the receiver substrate.

In some embodiments of the method, the method further includes scanning the receiver substrate while irradiating the donor material with the laser to form a selected pattern of the donor material on the target layer.

In some embodiments of the method, the e.g., selected pattern of the donor material on the target layer comprises a layer of the donor material on the target layer.

In some embodiments of the method, the donor substrate comprises nickel.

In some embodiments of the method, the donor substrate comprises organosilicon.

In some embodiments of the method, the donor substrate comprises polydimethylsiloxane.

In some embodiments of the method, the donor material comprises at least one of $Bi_2Se_{(3-x)}S_x$, $MoS_2$, hexagonal boron nitride (h-BN) or graphene.

In some embodiments of the method, the receiver substrate comprises silicon or silicon dioxide.

In some embodiments of the method, the receiver substrate comprises poly(methyl methacrylate).

In some embodiments of the method, the method further comprises applying a dynamic release layer to the front surface of the donor substrate. In some embodiments of the method, the method further comprises applying the donor material to the dynamic release layer.

In some embodiments of the method, the donor material is conductive ink, wherein the method further includes fashioning a touch sensor from the conductive ink.

A system is also disclosed. In one or more embodiments of the system, the system includes a laser configured to generate a first laser beam. In one or more embodiments of the system, the system further includes one or more optical elements configured to direct the first laser beam and the laser beam through a focusing lens. In one or more embodiments of the system, the system further includes one or more beam control elements configured to transmit the laser beam through the focusing lens. In one or more embodiments of the system, the system further includes a first translation stage assembly adapted to support a donor substrate. In one or more embodiments of the system, the donor substrate comprises a back surface and a front surface. In one or more embodiments of the system, the donor substrate further comprise a coating disposed on the front surface, wherein the coating includes a donor material. In one or more embodiments of the system, the system further includes a second translation stage assembly adapted to support a receiver substrate. In one or more embodiments of the system, the system further includes a vacuum chamber that encloses the donor and the receiver substrates and allows regulation of the pressure inside the chamber ($10^{-2}$-1000 mbar). In one or more embodiments of the system, the system further includes a controller communicatively coupled to the first and second translation stage assemblies and the one or more beam control elements. In one or more embodiments of the system, the controller is configured to direct the second translation stage assembly to align the receiver substrate to a focal plane of the objective lens. In one or more embodiments of the system, the controller is configured to direct at least one of the first translation stage or the second translation stage to align the front surface of the donor substrate to be parallel to and facing the receiver substrate, wherein the coating on the donor substrate is located at the focal plane of the objective lens. In one or more embodiments of the system, the controller is configured to direct at least one of first translation stage, the second translation stage, or the one or more beam control elements to irradiate the coating through the back surface of the donor substrate to transfer a portion of the donor material to the target layer of the receiver substrate.

In one or more embodiments of the system, directing at least one of the first translation stage, the second translation stage, or the one or more beam control elements to irradiate the coating through the back surface of the donor substrate to transfer a portion of the donor material to the target layer of the receiver substrate comprises directing at least one of the first translation stage, the second translation stage, or the one or more beam control elements to scan the donor substrate through a focal point of the second laser while irradiating the donor material with the second laser to continuously provide new donor material to transfer to the receiver substrate. In one or more embodiments of the system, directing at least one of the first translation stage, the second translation stage, or the one or more beam control elements to irradiate the coating through the back surface of the donor substrate to transfer a portion of the donor material to the target layer of the receiver substrate comprises directing at least one of first translation stage, the second translation stage, or the one or more beam control elements to scan the receiver substrate while irradiating the donor material with the second laser to form a selected pattern of the donor material on the target layer of the receiver substrate.

In one or more embodiments of the system, the selected pattern of the donor material on the target layer comprises a layer of the donor material on the target layer.

In one or more embodiments of the system, the donor material is conductive ink, wherein the system fashions a touch sensor on the receiver substrate via the conductive ink.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims.

FIG. 8 illustrates a method 800 for transferring donor material, in accordance with one or more embodiments of the disclosure.

DETAILED DESCRIPTION

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to a system 100 and method for printing highly resolved pixels of two-dimensional (2D) materials on a substrate. The system and method are based on Laser Induced Forward Transfer (LIFT) technology, which facilitates the printing of graphene, $MoS_2$, hexagonal boron nitride (h-BN), $Bi_2Se_{(3-x)}S_x$, and other materials onto $SiO_2$/Si and flexible polymers, and other substrates. The transferred 2D materials are employed for the fabrication of devices including flexible touch sensors and Field-Effect-Transistors. The system and method may also be used to generate Heterostructures of 2D materials. 2D materials are generally defined as defined as (e.g., crystalline materials) consisting of single- or few-layer atoms, in which the in-plane interatomic interactions are much stronger than those along the stacking direction. The system and method are also capable of generating stacks of 2D heterostructures, enabling multilayers of diversified or alternating 2D materials with atomically clean interfaces.

Therefore, the method offers control over both the lateral and the vertical direction and allows the digital fabrication of engineered geometrical constructs comprising 2D materials.

Figure 1:
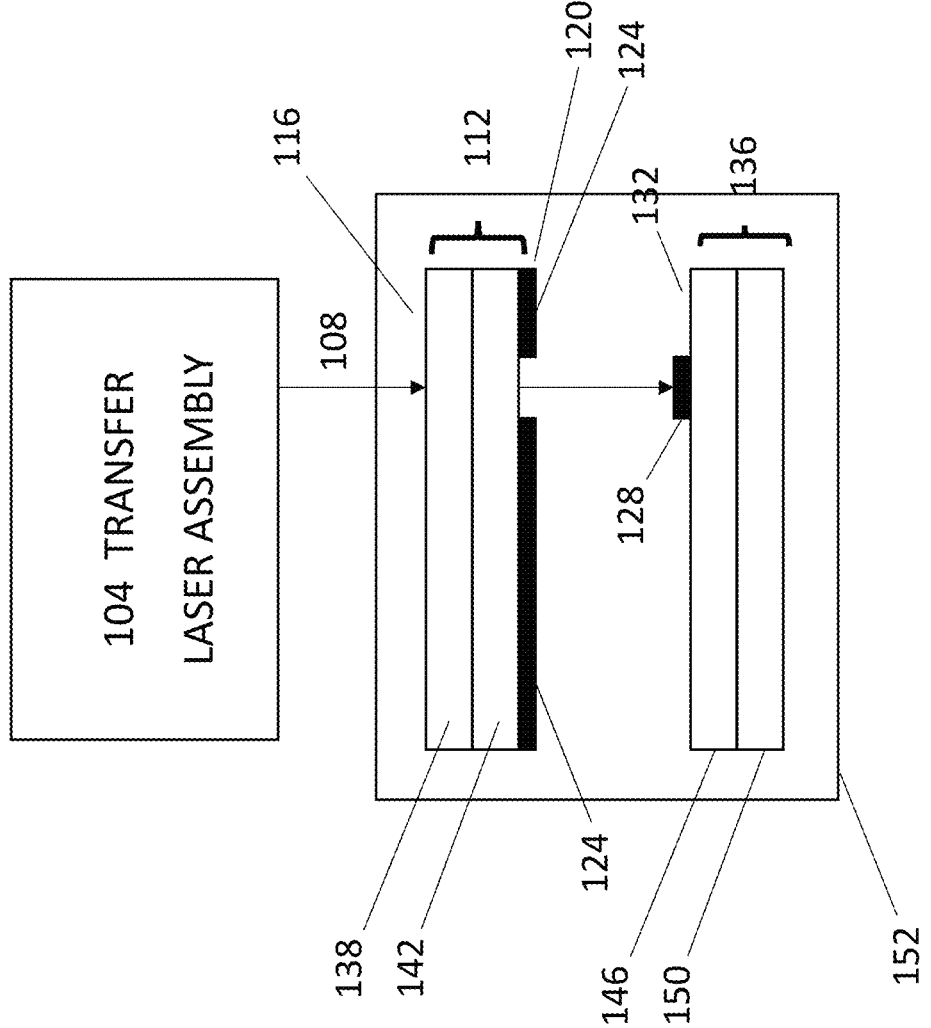
FIG. 1 illustrates a diagram of a laser transfer assembly for the system 100 in accordance with one or more embodiments of the present disclosure.

FIG. 1 illustrates a diagram of a laser transfer assembly 104 for the system 100, in accordance with one or more embodiments of the present disclosure. The transfer laser assembly 104 is configured to produce a transfer beam 108 capable of laser induced forward transfer (LIFT). The system 100 includes a vacuum chamber 110 which regulates the pressure inside the chamber. The laser transfer assembly 104 includes a donor substrate 112 that receives the transfer beam 108 on a back surface 116. The donor substrate may also be coated on a front surface 120 with donor material 124. Upon the donor substrate 112 receiving the transfer beam on the back surface a transfer material portion 128 of the donor material 124 corresponding to the position of the transfer beam 108 is ejected from the front surface 120 of the donor substrate 112, landing on a receiving side 132 of a receiver substrate 136 (e.g., the material or object to be coated by the donor material 124). The donor material 124 may be any material that is to be deposited onto the receiver substrate 136, including but not limited to graphene, $MoS_2$, hexagonal boron nitride (h-BN), and $Bi_2Se_{(3-x)}S_x$.

The vacuum chamber 110 may be configured to generate any vacuum or any range of vacuum values. For example, the vacuum chamber 110 may be configured to generate a vacuum in a range of 1000 mbar (e.g., essentially near atmospheric or ambient pressure) to 0.02 mbar. In another example, the vacuum chamber 110 may be configured to generate a vacuum in a range of 1000 mbar to 0.2 mbar. In another example, the vacuum chamber 110 may be configured to generate a vacuum in a range of 1000 mbar to 0.2 mbar. In another example, the vacuum chamber 110 may be configured to generate a vacuum in a range of 1000 mbar to 2 mbar. In another example, the vacuum chamber 110 may be configured to generate a vacuum in a range of 1000 mbar to 20 mbar. In another example, the vacuum chamber 110 may be configured to generate a vacuum of approximately 35 mbar (e.g., 30-40 mbar). The creation of a vacuum in the vacuum chamber reduces the air resistance to the donor material 124 as it travels from the donor substrate 112 to the receiver substrate 136.

The donor substrate 112 may be formed of any type of material capable of LIFT techniques and may contain multiple layers. For example, the donor substrate 112 may be configured with a first donor layer 138 and a second donor layer. For instance, the first donor layer 138 may be configured as a durable translucent layer constructed of material capable of maintaining structure under high illumination intensities, including but not limited to quartz and silica (e.g., a fused silica plate). The second donor layer 142 may be configured as a layer capable of binding the first donor layer 138 on one side, while binding the donor material 124 on the opposite side. For instance, the second donor layer 142 may be comprised of a metal including but not limited to nickel, nickel-alloy, platinum, aluminum, titanium, or gold material. In another example, the second donor layer may be configured as an organosilicon compound such as polydimethylsiloxane (PDMS). In another example, the second donor layer may be configured as sapphire. Donor material may also include any glass substrate, silicon, a silicon and silicon dioxide mixture.

The receiver substrate 136 may be formed of any type of material capable of receiving LIFT transferred material and may contain multiple layers. For example, the receiver substrate 136 may be configured with a first receiving layer 146 and a second receiving layer 150. For instance, the first receiving layer may be constructed of a layer of silicon dioxide that is itself bound to the second receiving layer constructed of silicon (e.g., materials common to integrated circuits and related technologies). In another example, the receiver substrate 136 may be constructed of one or more polymers (e.g., flexible polymers) used in the electronics industry. For instance, the receiver substrate 136 may include poly(methyl methacrylate) (PMMA). The receiver substrate 136, along with the donor material 124, may be configured as, or employed for the fabrication of, any electronic or electronic-related component including but not limited to sensors (e.g., touch sensors), transistors (e.g., field effect transistors), capacitors, resistors, wires, circuits, integrated circuits, and circuit boards (e.g., printed circuit boards (PCBs)). For example, the receiver substrate 136 may be configured as a PCB, while the transfer material portion 128 is conducting ink (e.g., made of 2D material). For instance, the laser transfer assembly 104 may be configured to create a touch sensor upon a PCB using 2D material via LIFT. In another instance, the laser transfer assembly 104 may be configured to create a field effect transistor upon a PCB using 2D material via LIFT.

LIFT printing facilitates precise layering control of a variety of 2D materials onto a variety of donor substrates (e.g., such as control boards). The precision of LIFT is due in part to the ability of the transfer beam 108 to form small and consistent beam spots. LIFT is a digital method, discarding the need for masks, and is capable of generating any 2D geometrical shape on—demand relying on the beam spot size and shape and the scanning of the laser beam. The beam spot size and shape can be tuned using optical components. The non-recurring engineering time and cost for a new batch is very limited with respect to standard etching and wet transfer methods. LIFT also requires less energy for material transfer than conventional methods.

Figure 2:
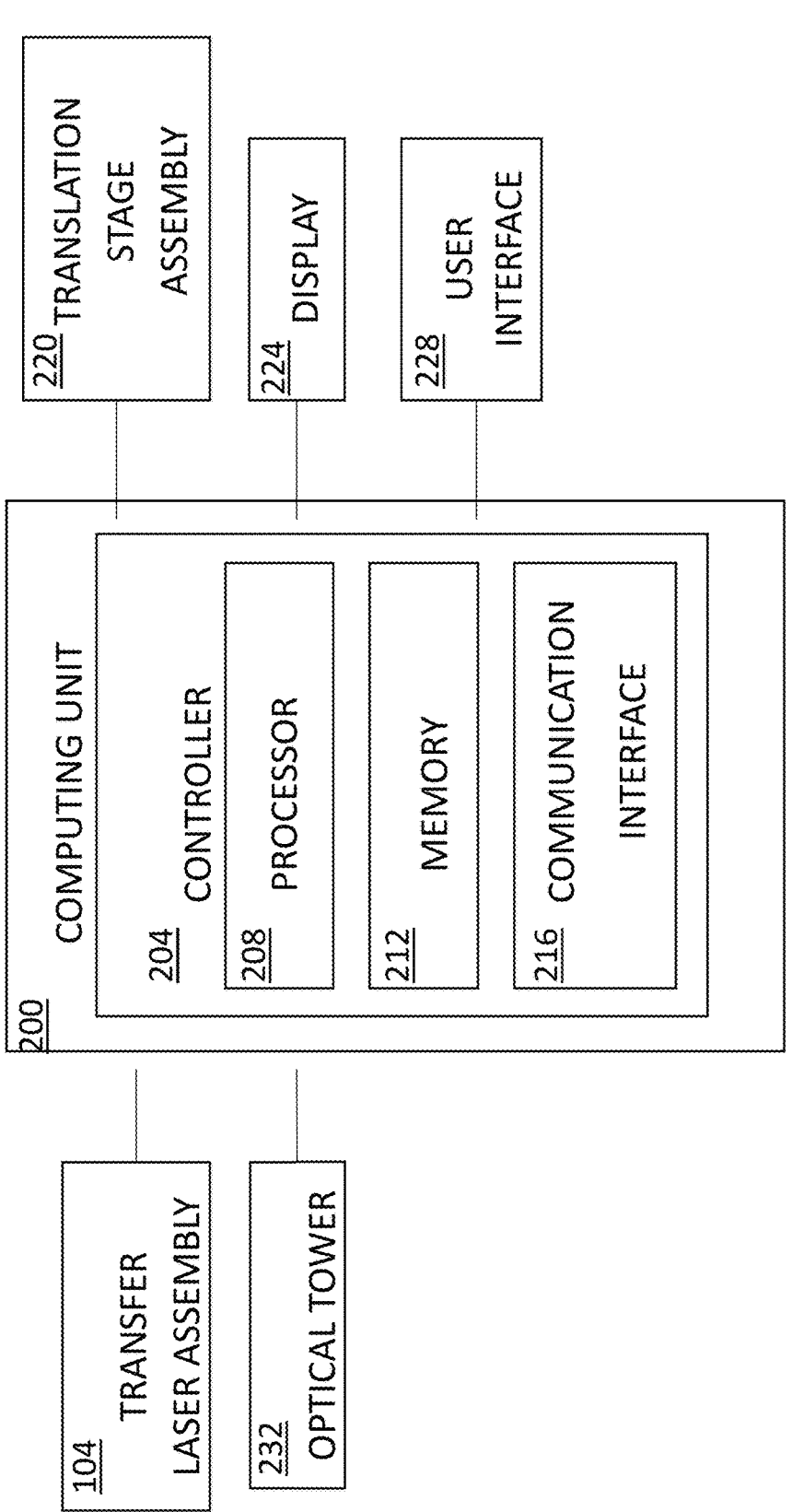
FIG. 2 is a block diagram illustrating control componentry for the system, in accordance with one or more embodiments of the disclosure.

FIG. 2 is a block diagram illustrating control componentry for the system 100, in accordance with one or more embodiments of the disclosure. For example, the system 100 may include one or more computing units 200 configured to provide the processing ability to carry out the functions of the system 100 and to facilitate communication between components and/or modules of the system 100. For example, the computing unit 200 may be communicatively coupled to the transfer laser assembly 104. The computing unit 200 includes a controller 204 configured to perform the functionality performed within. The computing unit 200 may be configured as any device capable of automating and/or controlling componentry of the system 100. For example, the computing unit 200 may be a desktop computer. In another example, the computing unit 200 may be a laptop computer. The controller 204 may include one or more processors 208, memory 212, and a communication interface 216.

The one or more processors 208 may include any processor or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors 208 may include any device configured to execute algorithms and/or instructions (e.g., program instructions stored in memory). In one embodiment, the one or more processors 208 may be embodied as a desktop computer, mainframe computer system, workstation, image computer, parallel processor, networked computer, or any other computer system configured to execute a program configured to operate or operate in conjunction with the system 100, as described throughout the present disclosure. Moreover, different subsystems of the system 100 may include a processor or logic elements suitable for carrying out at least a portion of the steps described in the present disclosure. Therefore, the above description should not be interpreted as a limitation on the embodiments of the present disclosure but merely as an illustration.

The memory 212 can be an example of tangible, computer-readable storage medium that provides storage functionality to store various data and/or program code associated with operation of the controller 204 and/or other components of the system 100, such as software programs and/or code segments, or other data to instruct the controller and/or other components to perform the functionality described herein. Thus, the memory 212 can store data, such as a program of instructions for operating the system 100 or other components. It should be noted that while a single memory 212 is described, a wide variety of types and combinations of memory 212 (e.g., tangible, non-transitory memory) can be employed. The memory can be integral with the controller, can comprise stand-alone memory, or can be a combination of both. Some examples of the memory 212 can include removable and non-removable memory components, such as random-access memory (RAM), read-only memory (ROM), flash memory (e.g., a secure digital (SD) memory card, a mini-SD memory card, and/or a micro-SD memory card), solid-state drive (SSD) memory, magnetic memory, optical memory, universal serial bus (USB) memory devices, hard disk memory, external memory, and so forth.

The communication interface 216 can be operatively configured to communicate with components of the controller 204 and other components of the system 100. For example, the communication interface 216 can be configured to retrieve data from the controller 204 or other components, transmit data for storage in the memory 212, retrieve data from storage in the memory 212, and so forth. The communication interface 216 can also be communicatively coupled with controller 204 and/or system elements to facilitate data transfer between system components. The system 100 may further include a translation stage assembly 220, a display 224, a user interface 228, and/or an optical tower 232 communicatively coupled to the computing unit 200.

The user interface 228 is configured to receive input from a user. The one or more user interfaces 228 may include one or more input devices that may include any user input device known in the art. For example, the one or more input devices may include, but are not limited to, a keyboard, a keypad, a touchscreen, a lever, a knob, a scroll wheel, a track ball, a switch, a dial, a sliding bar, a scroll bar, a slide, a handle, a touch pad, a paddle, a steering wheel, a joystick, a bezel input device, or the like.

Figure 3:
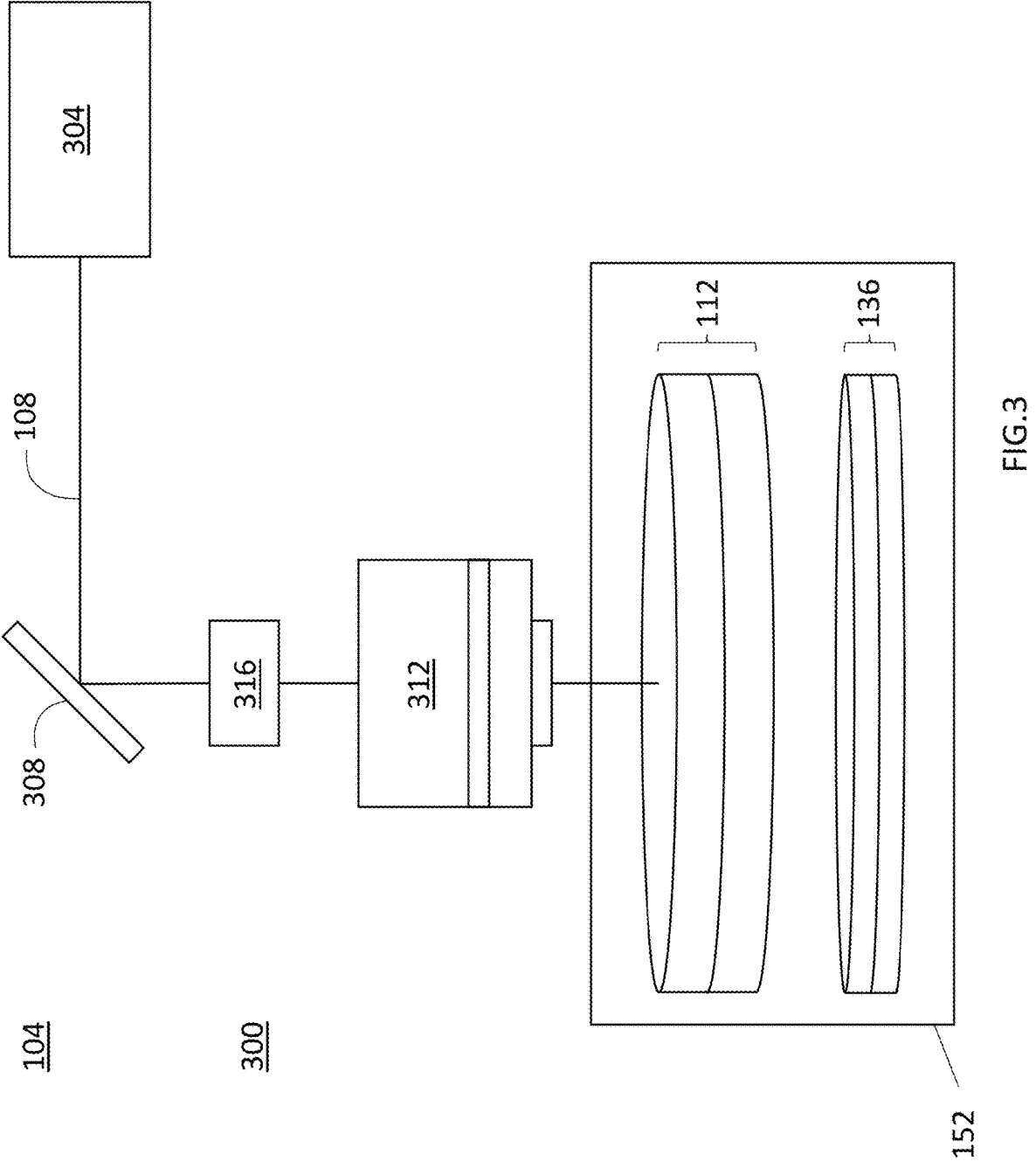
FIG. 3 illustrates a detailed diagram of the transfer optic system transfer laser assembly of the system, in accordance with one or more embodiments of the present disclosure.

FIG. 3 illustrates a detailed diagram of transfer laser assembly 104 of the system 100, in accordance with one or more embodiments of the present disclosure. In embodiments, the transfer laser assembly 130 includes transfer laser 304. The transfer laser 304 produces the transfer beam 108 that transfers donor material 124 to the receiver substrate 136. The transfer laser 300 may be any laser known in the art used for transferring donor material 124 including but not limited to a solid-state laser, a gas laser, a dye laser, or a semiconductor laser. For example, the transfer laser 304 may be a diode pumped solid state laser. For instance, the transfer laser 304 may be a diode pumped Nd:YAG solid-state micro-laser. The transfer laser assembly 104 may include the transfer laser 304 and associated refractive/reflective componentry, and may also include the donor substrate 112 and the receiver substrate 136.

The transfer beam 108 produced by the transfer laser 304 may be of any wavelength or wavelength range known in the art (e.g., from approximately 193 nm to 2500 nm). For example, the transfer laser 304 may produce a transfer beam 108 in the visible spectrum (e.g., 380 to 780 nm). For instance, the transfer beam 108 may have a wavelength of approximately 532 nm. In another example, the transfer laser 304 may produce a transfer beam 140 in the near infrared spectrum (e.g., 780 to 2500 nm).

In some embodiments, the transfer beam 108 produced by the transfer laser 304 may be pulsed. The pulse rate of the transfer beam 108 may be any pulse rate or range of pulse rates known in the art. For example, the transfer laser 304 may produce a transfer beam 108 with a pulse rate ranging from 1 Hz to 10 kHz. In another example, the transfer laser 304 may produce a transfer beam 108 with a pulse rate ranging from 10 Hz to 1 kHz. For instance, the transfer laser may produce a translation beam 140 with a pulse rate of approximately 10 Hz. In another example, the transfer laser 304 may produce a translation beam 108 with a pulse rate ranging from 100 Hz to 1 kHz. For instance, the transfer laser 304 may produce a translation beam 108 with a pulse rate of approximately 1 kHz.

In embodiments, the transfer laser 304 produces a pulsed transfer beam 108 with a specific pulse length or range of pulse lengths. The pulse length of the transfer beam 108 may be any pulse rate known in the art. For example, the length of the pulse of the transfer beam 108 may range from 60 ps to 6 ns. In another example, the length of the pulse of the transfer beam 108 may range from 100 ps to 1 ns. In another example, the length of the pulse of the transfer beam 108 may be approximately 600 ps.

In embodiments, the transfer laser 304 produces a transfer beam 140 with a specific fluence or range of fluences. The fluence of the transfer beam 140 may be any range or value known in the art. For example, the fluence of the transfer beam 108 may be in the range of 10 mJ/cm$^2$ to 10 J/cm$^2$. In another example, the fluence of the transfer beam 108 may be in the range of 100 mJ/cm$^2$ to 1 J/cm$^2$. In another example, the fluence of the transfer beam 108 may be in the range of 100 mJ/cm$^2$ to 500 mJ/cm$^2$. In still another example, the fluence of the transfer beam 140 may be in the range of 300 mJ/cm$^2$ to 800 mJ/cm$^2$.

In embodiments, the transfer laser assembly 104 includes one or more optical elements configured to direct the transfer beam 108. The optical elements may be any known in the art including but not limited to mirrors, lenses, and beamsplitters. For example, the optical element may include one or more reflecting mirrors 308. In another example, the optical element may be an optical attenuator 316. For example, the optical element may be a fixed attenuator plate. In another example, the optical element may include one or more focusing lenses 312 (e.g., an f-theta scan lens). For instance, the one or more focusing lenses 312 may be a 100 mm f-theta scan lens. In embodiments, the focusing lens 230 controls the cross-sectional area of the laser spot upon the donor substrate 112 or the receiver substrate 136. The focusing lens 230 may be any type of lens known in the art including but not limited to an achromatic lens. For example, the focusing lens 230 may be a 150 mm achromatic lens. In another example, the focusing lens 230 may be a 75 mm achromatic lens.

In embodiments, donor substrate 112 aids in the transfer of the donor material 124 to the receiver substrate 160. For example, the front surface 120 of the donor substrate 112 may include or be coated with a laser absorbing layer (e.g., a dynamic release layer), that absorbs laser energy. The donor substrate 112 further includes a back surface 116 that initially receives the transfer beam 108. During LIFT, a layer of donor material 124 is coated over front surface 120. When the transfer laser 304 is activated, the transfer beam 108 enters the back surface 116 of the donor substrate 112. Once the transfer beam 108 reaches the laser absorbing layer, localized heating at the laser absorbing layer and the coating of donor material 124 create a high-pressure vapor bubble or pressure wave within a localized area. The expansion of the vapor bubble then drives the ejection of the transfer material portion 128 of the donor material 124 towards the receiver substrate 160.

In some embodiments, the donor substrate 320 is a quartz plate. In some embodiments, the donor substrate is a fused silica plate. In some embodiments, the donor substrate is coated with a film. For example, the film may be a polymeric organosilicon compound (e.g., polydimethylsiloxane (PDMS)). In another example, the coating may be a thin gold film.

The size or range of sizes of the transfer material portion 128 of the donor material 124 may be adjusted for the specific LIFT requirements. For example, the transfer material portion may have an area ranging from 1 $\mu m^2$ to 1 $mm^2$. In another example, the area of the material portion 128 may range from 10 $\mu m^2$ to 100 $\mu m^2$. In another example, the area of the material portion may be approximately 900 $\mu m^2$ (e.g., a 30 $\mu m \times 30$ $\mu m$ square). In another example, the area of the material portion may be approximately 0.09 $\mu m^2$ (e.g., a 300 $\mu m \times 300$ $\mu m$ square).

Figure 4:
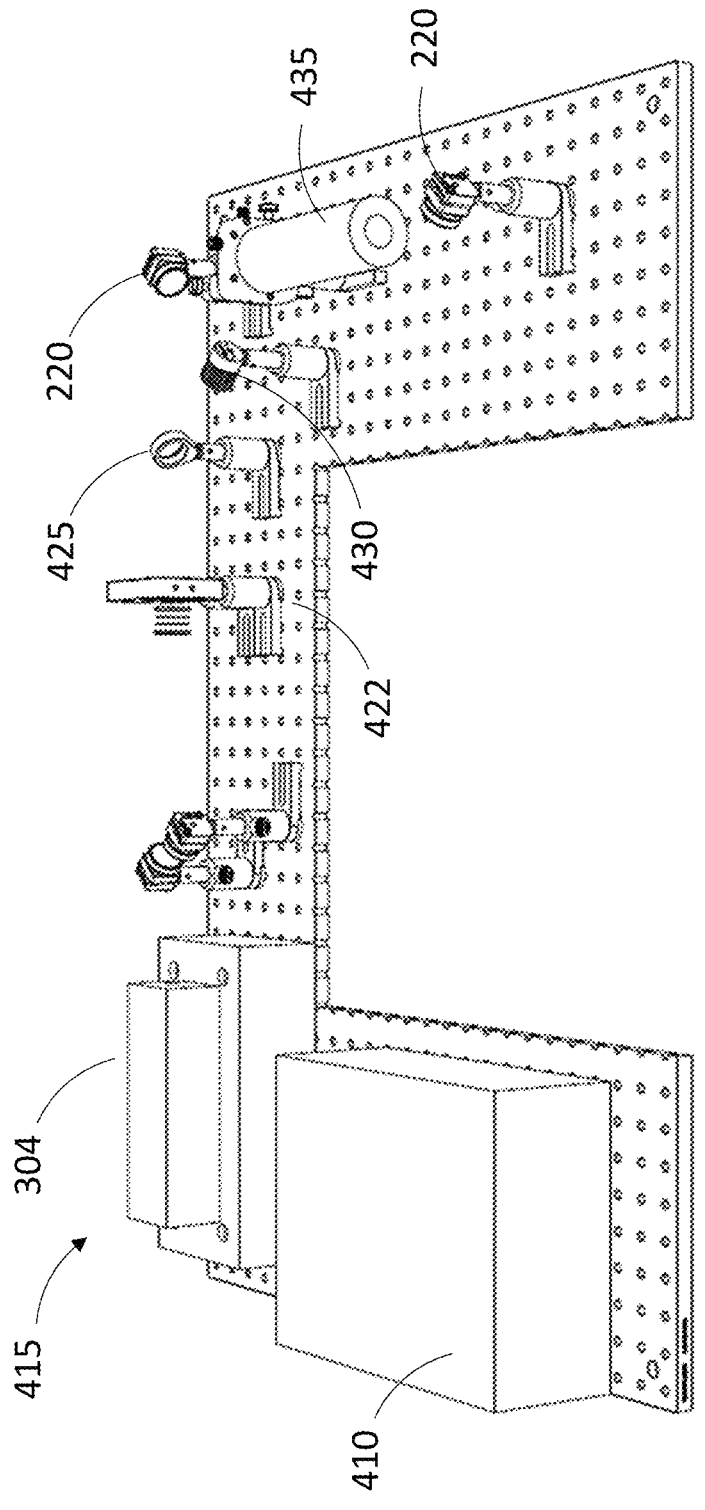
FIG. 4 illustrates a diagram of support and componentry for the system in accordance with one or more embodiments of the disclosure.

FIG. 4 illustrates a diagram of support and componentry for the system 100 in accordance with one or more embodiments of the disclosure. In embodiments, the system includes a top breadboard 405. The top breadboard 405 may be aluminum and further include holes (e.g., M6 threads) to support system componentry. The system may include a laser controller 410 positioned near the transfer laser 304. The laser controller 410 controls one or more parameters of the laser (e.g., power and/or pulse rate).

The system 100 may include a rotator 422, a polarizer 425 and a beam dump 430. The polarizer may be configured to be set at a Brewster's angle. The beam dump 430 may be configured to effectively trap the portion of the beam that is reflected from the polarizer 425. In embodiments, the system 100 further includes a beam expander 435 to magnify the beam. Multiple reflecting mirrors 308 are used to direct the transfer beam 108.

Figure 5:
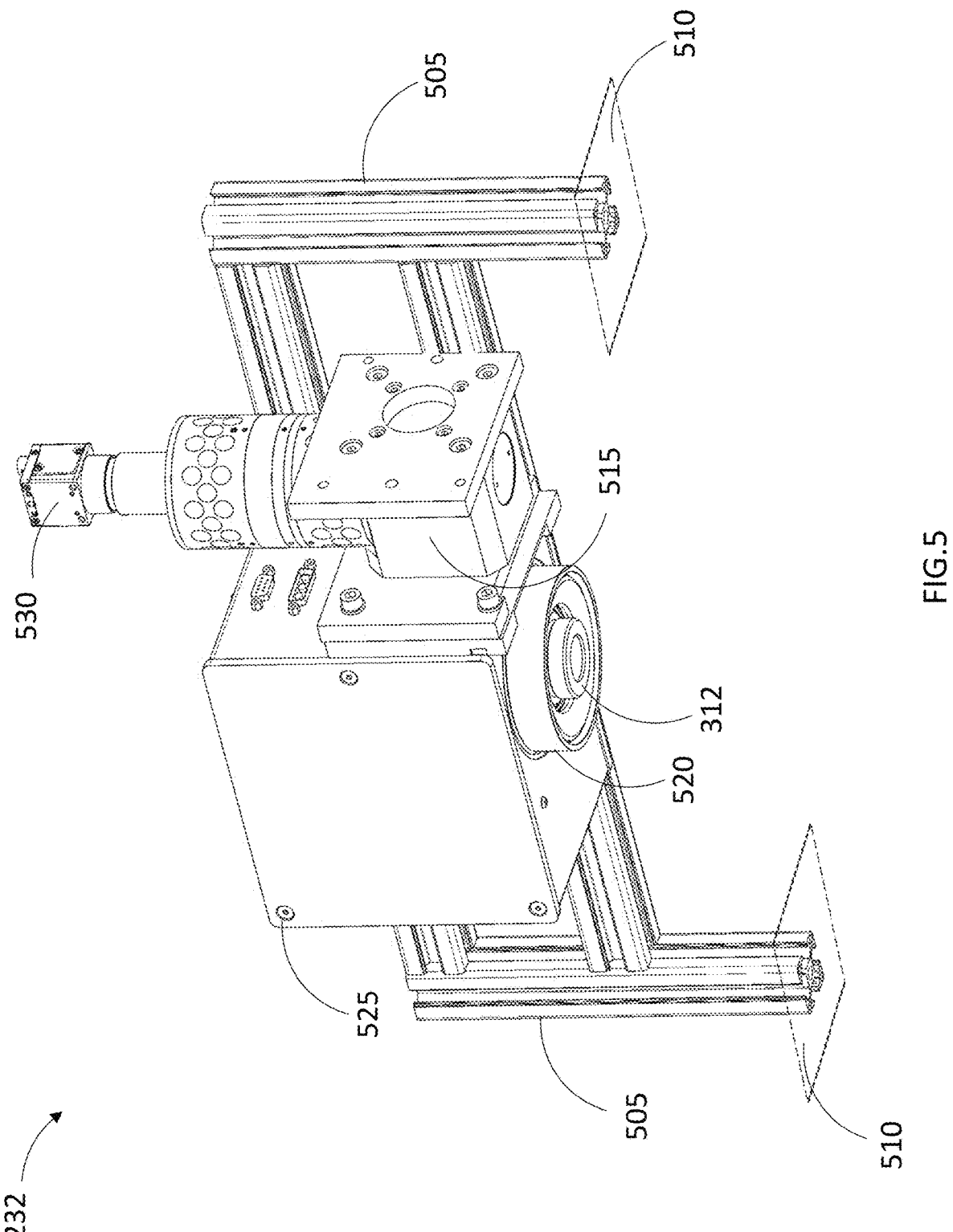
FIG. 5 illustrates a diagram of the optical tower 232 for the system 100 in accordance with one or more embodiments of the disclosure.

FIG. 5 illustrates a diagram of the optical tower 232 for the system 100 in accordance with one or more embodiments of the disclosure. The optical tower 232 may be utilized for both the LIFT procedure and imagery purposes. In embodiments, the optical tower 232 includes an optic rail 505 mounted to a base breadboard 510 that supports the elements of the optical tower 232. The optical tower 500 further includes a 2D galvanometric scanner 525, and a beam splitter 515 that directs the transfer beam 108 to the focusing lens 312.

The optical tower 232 further includes a light source 520 mounted coaxially with the 2D galvanometric scanner 525 and the f-theta or the focusing lens 312. The light source 520 is configured to illuminate the receiver substrate 136 and/or the donor substrate 112, allowing observance by a camera 530 (e.g., a CCD camera). The light source 520 may include any type of light source known in the art including but not limited to a light emitting diode.

Figure 6:
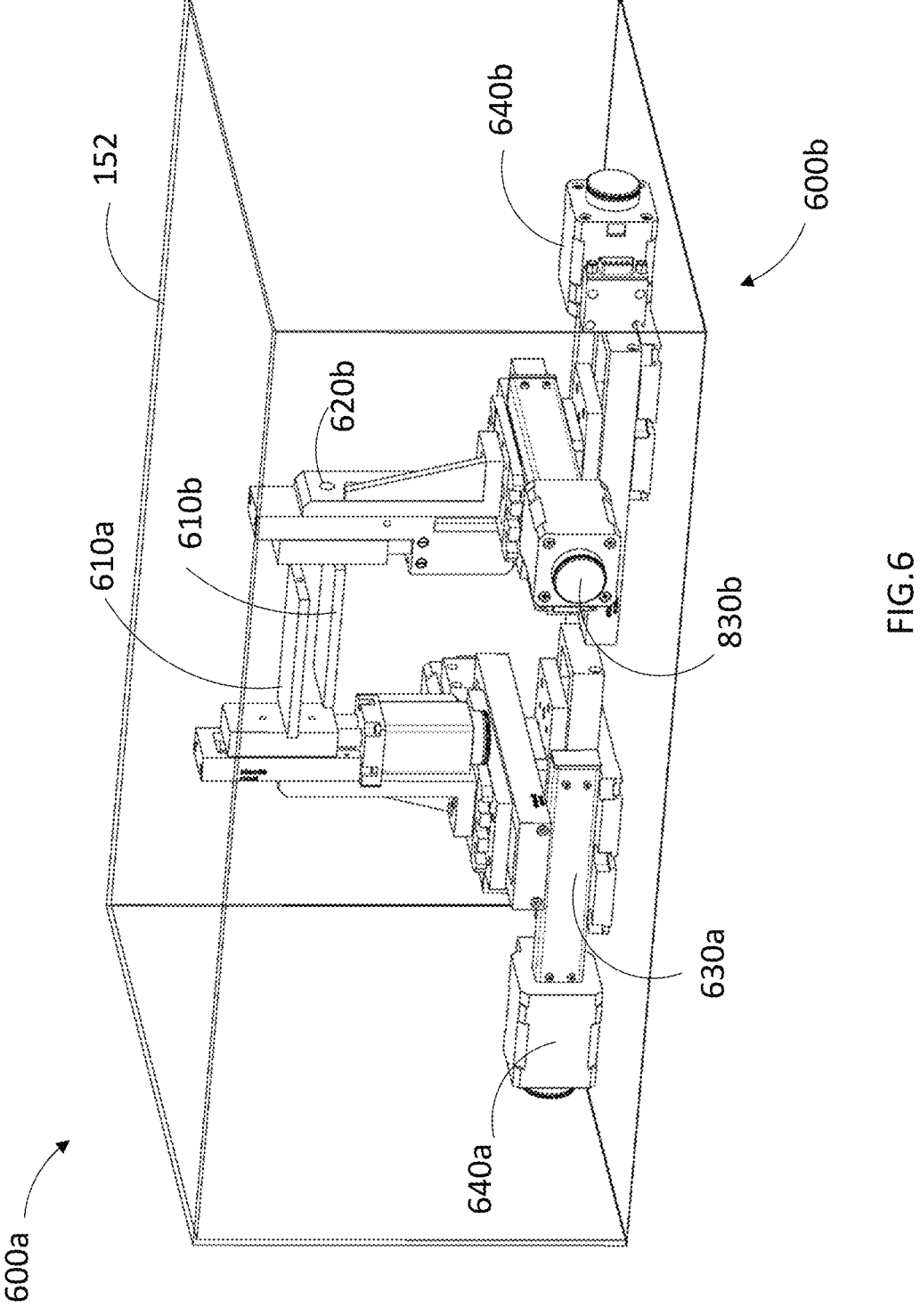
FIG. 6 illustrates a diagram of two translation stage assemblies for the system in accordance with one or more embodiments of the disclosure.

FIG. 6 illustrates a diagram of two translation stage assemblies 220a, 220b for the system 100 in accordance with one or more embodiments of the disclosure. The two translation stage assemblies 220a, 220b are arranged so that the receiver substrate 136 is mounted to one of the translation stage assemblies 220a, while the donor substrate 136 is mounted to the other translation stage assembly 220b (e.g., one of the translation stage assemblies 220a, 220b is adapted to support the donor substrate 112, while the other of the translation stage assemblies 220a, 220b is adapted to support the receiver substrate 136), while both are enclosed in the vacuum chamber 110. In embodiments, each translation stage assembly 220a, 220b includes a mounting surface 610a, 610b that are coupled to a first translatable stage 620a, 620b translatable on a z-axis. The first translatable stage 620a, 620b is coupled to a second translatable stage 630a, 630b and a third translatable stage 640a, 640b configured for X-axis and Y-axis translation. It should be understood that the first translatable stage 620a, 620b, second translatable stage 630a, 630b, and/or third translatable stage 640a, 640b may be motorized (e.g., under the control of the computing unit 200). It should also be understood that any configuration of translation stages may be used to for X-axis, Y-axis, and Z-axis movement of the donor substrate 112 or the receiver substrate 136. Therefore, the above description is not intended to be a limitation of the present disclosure, but merely an illustration.

Figure 7:
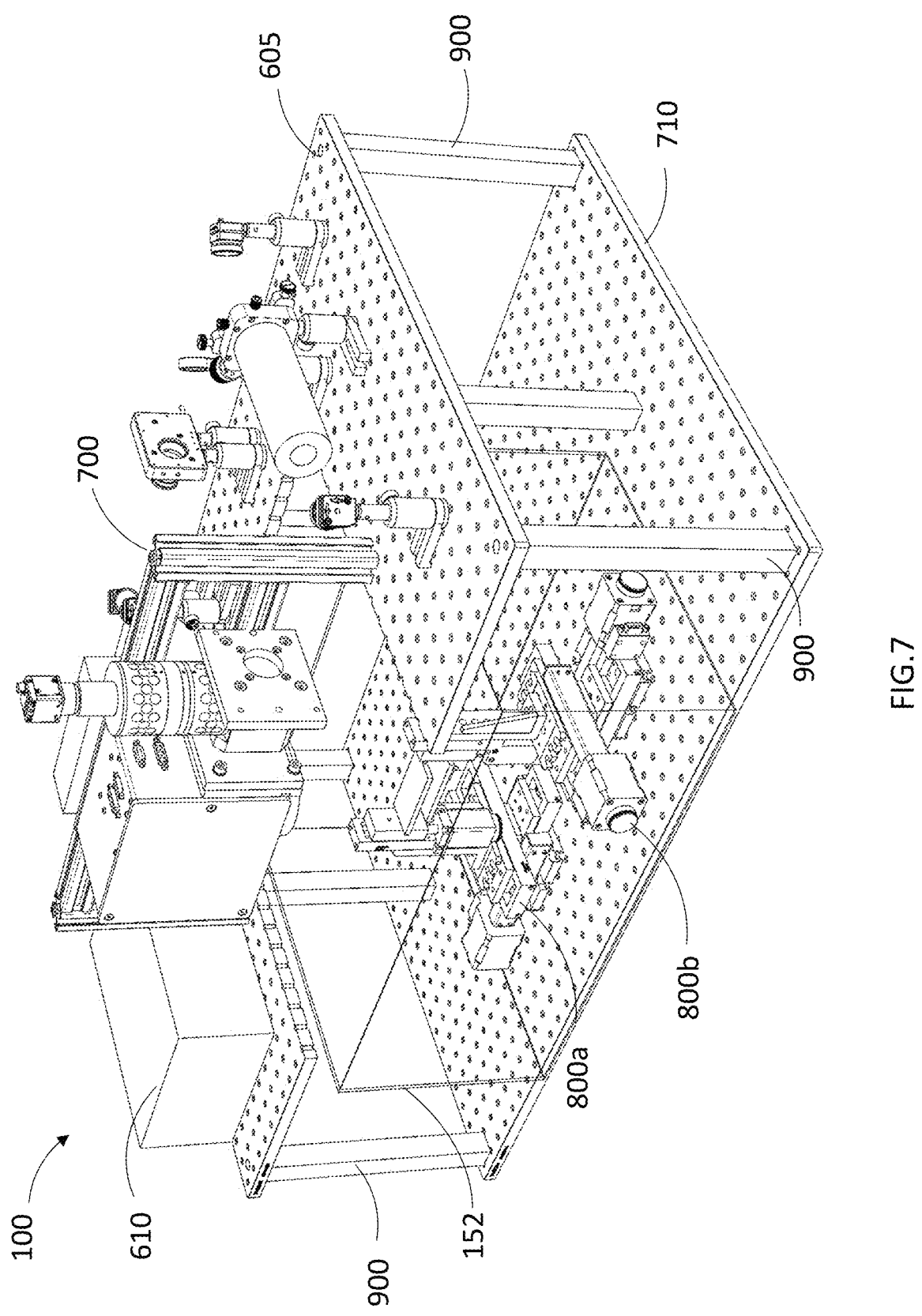
FIG. 7 illustrates an overall diagram of the system, in accordance with one or more embodiments of the disclosure.

FIG. 7 illustrates a diagram of the system 100, in accordance with one or more embodiments of the disclosure. The top breadboard 405 is mounted onto the base breadboard via one or more columns 700. The optical tower 232 and the translation stage assemblies 220a, 220b are mounted to the base breadboard 510. Is should be understood that the system 100 may include, or may not include, one or more components as described herein. For example, the system 100 may include a scanning electronic microscope (SEM) instead of an optical tower 232. Therefore, the above description should not be interpreted as a limitation on the embodiments of the present disclosure but merely as an illustration.

FIG. 8 illustrates a method 800 for transferring donor material, in accordance with one or more embodiments of the disclosure. Accordingly, method 800 may include any step expressed or implied by the foregoing embodiments of the system 100. Further, it is contemplated that one or more steps of method 800 may be executed by a system or device known to the art beyond those described above. As such, method 800 should be understood to encompass any configuration for carrying out the following steps.

In embodiments, the method 800 comprises a step 810 of generating the receiver substrate 136. The receiver substrate 136 may be produced by any methods and materials as described herein. The method 800 further includes a step 820 of generating the donor substrate 112, wherein the donor substrate 112 comprises a back surface 116 and the front surface 120. The method 800 further includes a step 830 of applying a coating to the front surface 120, wherein the coating includes donor material 124. For example, the donor material 310 may include graphene, $MoS_2$, hexagonal boron nitride (h-BN), and/or $Bi_2Se_{(3-x)}S_x$.

The method 800 further includes a step 840 of aligning the front surface 120 of the donor substrate 112 to be parallel to and facing the receiver substrate 136, wherein the donor material 124 is disposed adjacent a target layer (e.g., the first receiving layer 146, or a coating on the first receiving layer). The alignment may be performed by the translation stage assemblies 220*a*, 220*b*.

The method 800 further includes a step 850 of configuring the pressure inside the vacuum chamber 110 which encloses the donor substrate 112 and the receiver substrate 136.

The method 800 further includes a step 860 of irradiating the coating through the back surface 116 of the donor substrate 112 with one or more laser pulses produced by a laser (e.g., transfer laser 304) to transfer a portion of the donor material 124 to the target layer. In embodiments, the method 800 further includes a step 870 of scanning the donor substrate 112 through a focal point of the laser while irradiating the donor material 310 with the laser to continuously provide new donor material 124 to transfer to the receiver substrate 136. By moving/translating the donor substrate 112 along the same plane as the receiver substrate 136, the donor substrate 112 can keep supplying donor material 124 from the coating until the donor material 124 from the coating is depleted.

The method 800 further includes a step 880 of scanning the receiver substrate 136 while irradiating the donor material 124 with the laser to form a selected pattern of the donor material 124 on the target layer. The selected pattern may include one, or more than one, layers of donor material 124 that has been deposited on the target layer.

The following examples are intended only to further illustrate the invention and are not intended to limit the scope of the subject matter which is defined by the claims.

EXAMPLE 1

Preparation of LIFT Donor Substrates

Graphene was grown on a poly-crystalline copper (Cu) foil catalyst (18 μm) via chemical vapor deposition using a Cold Wall CVD Reactor from Aixtron. The Cu foil was chemically treated and thermally annealed prior to the graphene growth at 1000° C. and at low pressure using methane as the carbon source. The graphene was transferred from the Cu foils to Ni coated (50 nm) quartz substrates using a standard wet transfer process where a poly(methyl methacrylate) (PMMA) layer is first applied onto the graphene/Cu followed by etching of the Cu foil. After cleaning the PMMA/graphene film in water to remove any excess Cu etching solution, the film is placed on the Ni coated quartz substrate by submerging the substrate in water. Finally, the PMMA is removed using acetone. For $MoS_2$, h-BN and $Bi_2Se_3$ donor substrates the materials were grown by CVD on quartz on Nickel (for $Bi_2Se_3$) and sapphire respectively (for h-BN and $Bi_2Se_{(3-x)}S_x$). For the graphene/h-BN heterostructures the graphene and the h-BN were grown as described above and transferred to h-BN and $SiO_2$, respectively.

EXAMPLE 2

LIFT Printing of $Bi_2Se_{(3-x)}S_x$ and Photocurrent Response in Graphene/$Bi_2Se_{(3-x)}S_x$ Field Effect Transistors $Bi_2Se_3$ flakes were transferred on graphene-coated Field Effect Transistor (FET) devices using LIFT. The graphene-FET substrate comprised gold electrodes as contacts and graphene applied on the active area of each transistor device.

Figure 9B:
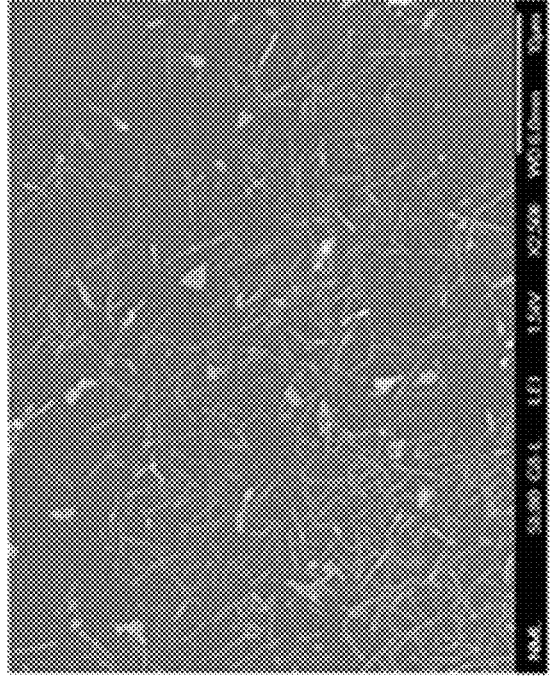
FIGS. 9A-B illustrate scanning electronic microscopy (SEM) images of LIFT-printed $Bi_2Se_3$, in accordance with one or more embodiments of the disclosure.
Figure 9A:
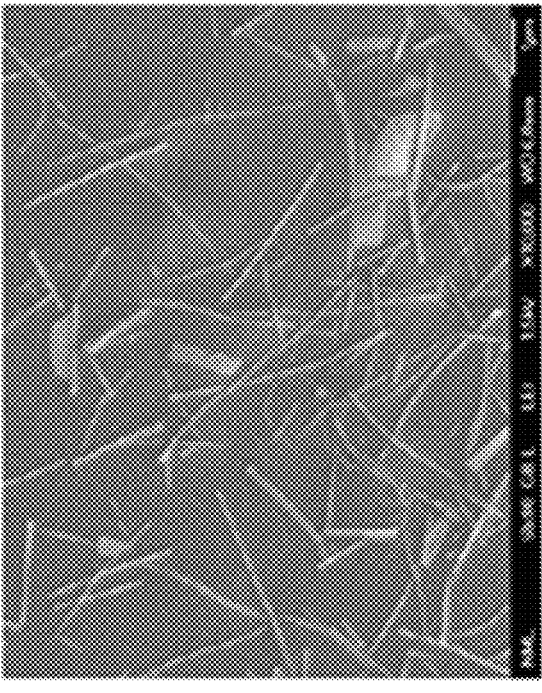

For the transfer the 3rd harmonic of a pulsed Nd:YAG laser was used and laser fluences between 0.50-2000 mJ/cm2 were used. The donor substrate comprised CVD grown, $Bi_2Se_{(3-x)}S_x$ on sapphire. By employing single laser pulses and selectively transferring the 2D material onto the active area of the FET devices, uniform coverage was achieved by applying an array pattern over the active area. The experiment was performed under reduced pressure (30-40 mbar) and the two substrates were brought near contact. The Raman spectrum of the printed $Bi_2Se_3$ is in agreement with the as grown material form the donor substrate, while scanning electron microscopy (SEM) measurements show that the transferred structures preserve their morphological characteristics, as shown in FIGS. 9A-B, in accordance with one or more embodiments of the disclosure.

For the characterization of the devices Id-Vg measurements as a function of temperature were performed showing stable operation and change of the Dirac point from 19V to 18V with decreasing temperature. Characterization of the photocurrent as a function of the gate voltage were performed at −40C. For Vg≤3V the electrical response increases with the main peaks shifting to shorter wavelengths (from 1.05 μm at Vg=3V to 0.96 μm at Vg=−15 V. When measuring the photocurrent as a function of the temperature in the visible-near IR spectral region the device shows an increased electrical response at Vg=0V. Measurements of the photocurrent within the visible to mid-IR spectral range showed electrical response in the visible to near IR region.

EXAMPLE 3

LIFT Printing of hBN and $MoS_2$

Figure 10B:
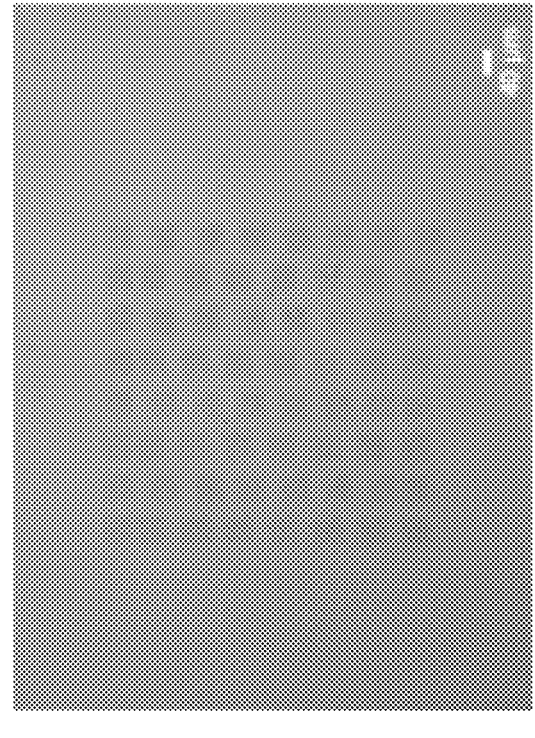
FIGS. 10A-B illustrate SEM and optical microscopy images of a LIFT printed $MoS_2$ and hBN printed substrates, respectively, in accordance with one or more embodiments of the disclosure.
Figure 10A:
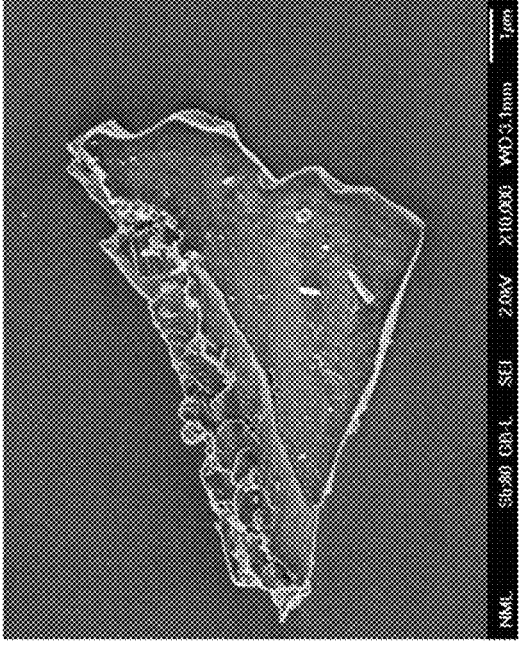
Figure 11B:
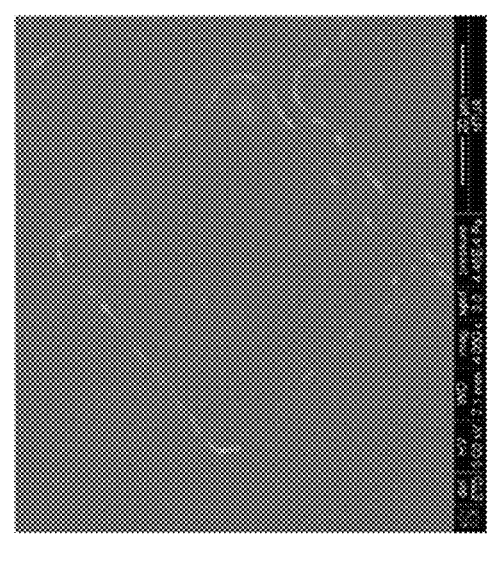
FIGS. 11A-D illustrate SEM images demonstrating LIFT of hBN in accordance with one or more embodiments of the disclosure.
Figure 11D:
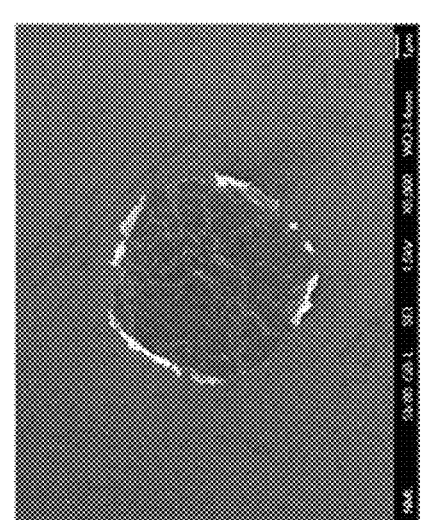
Figure 11A:
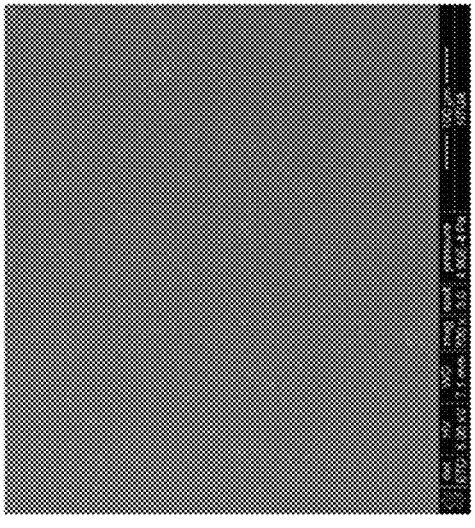
Figure 11C:
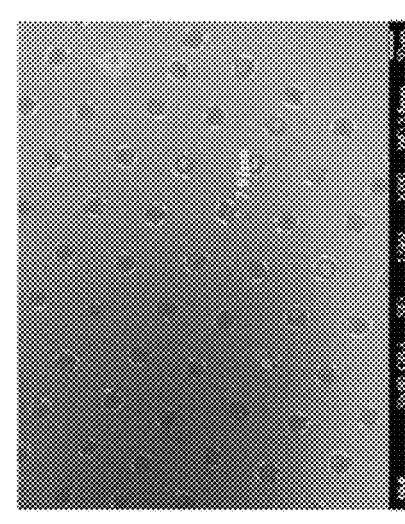

In another example, flakes of $MoS_2$ and hBN (hexagonal Boron Nitride) were transferred on flexible (PDMS, PEN) and glass substrates respectively using LIFT. An SEM image of LIFT printed $MoS_2$ and x) $S_x$ optical microscopy image of hBN LIFT printed on glass are shown in FIGS. 10A-B, respectively, in accordance with one or more embodiments of the disclosure. For the transfer the 3rd harmonic of a pulsed Nd:YAG laser was used and laser fluences between 0.50-2000 mJ/cm2 have been used. The donor substrate comprised CVD grown, $MoS_2$ on sapphire and CVD grown hBN on sapphire respectively. Single laser pulses were used to transfer single $MoS_2$ flakes and hBN. Raman and SEM characterization confirm the preservation of the structural and morphological characteristics of the materials after the transfer. The experiment was performed under reduced pressure (30 mbar) and the two substrates were brought near contact. FIG. 11A-D illustrate SEM photographs demonstrating LIFT of hBN in accordance with one or more embodiments of the disclosure. hBN was transferred with a 355 nM laser with nanosecond (ns) pulse duration with pixels of hBN transferred with 8 μm to 30 μm resolution. In this configuration, LIFT can transfer material in resolutions of 1 μm to 100 μm and is generally limited only by the diffraction limit of the laser wavelength.

EXAMPLE 4

LIFT Printing of Graphene or Graphene/hBN Heterostructures for Touch Sensor Device Fabrication Previous attempts to transfer graphene using laser pulses resulted in either graphene co-transferred with protective layers (e.g., PMMA) or irregular and defective patterns. Here, experiments were performed to identify key parameters that would preserve the shape and quality of graphene after transfer. For the laser printing experiments, a quartz/Ni/graphene or a quartz/Ni/hBN/graphene configuration is used as donor substrate.

The applied laser energy density (El) is an important factor that enables successful deposition within an optimum window between two threshold values. Below the lower threshold El, no transfer occurs. For single layer graphene on Ni, this minimum El is measured at 20 mJ/cm2, whereas slightly higher values (e.g., 30 mJ/cm2) lead to partial transfer. Energy densities above the upper limit of 100 mJ/cm2 result to violent ablation of Ni and the transferred species are predominantly melted Ni nanoparticles. Therefore, the optimum energy density window is determined in the range between 40-80 mJ/cm$^2$ (e.g., a sub-ablation regime) and the results described in the following were obtained with an El value of 50 mJ/cm$^2$.

Another parameter crucial in achieving a largely defect-free transfer of graphene is the pressure under which the experiment is performed. In particular, when LIFT is attempted under atmospheric pressure, the graphene monolayer lands on the receiver substrate in fragments and exhibits significant levels of folding. These results suggest that air resistance affects adversely the transfer of an atomic-thick layer of graphene. Experiments performed under low pressure (e.g., a few tens of mbar) achieve significantly better printing quality with uniform and continuous coverage of the receiver substrate by the transferred graphene monolayer. These results are demonstrated in FIGS. 12A-E, in accordance with one or more embodiments of this disclosure. For example, FIG. 12A demonstrates a via optical microscopy an array of laser printed graphene pixels onto a SiO$_2$/Si substrate (e.g., with 300 nm oxide thickness), with a pixel size of 30 μm×30 μm at a laser fluence of 50 mJ/cm$^2$. The printed pixels exhibit well-defined shapes that correspond to that of the projected laser beam.

Figures 12A, 12B, 12C, 12D, 12E:
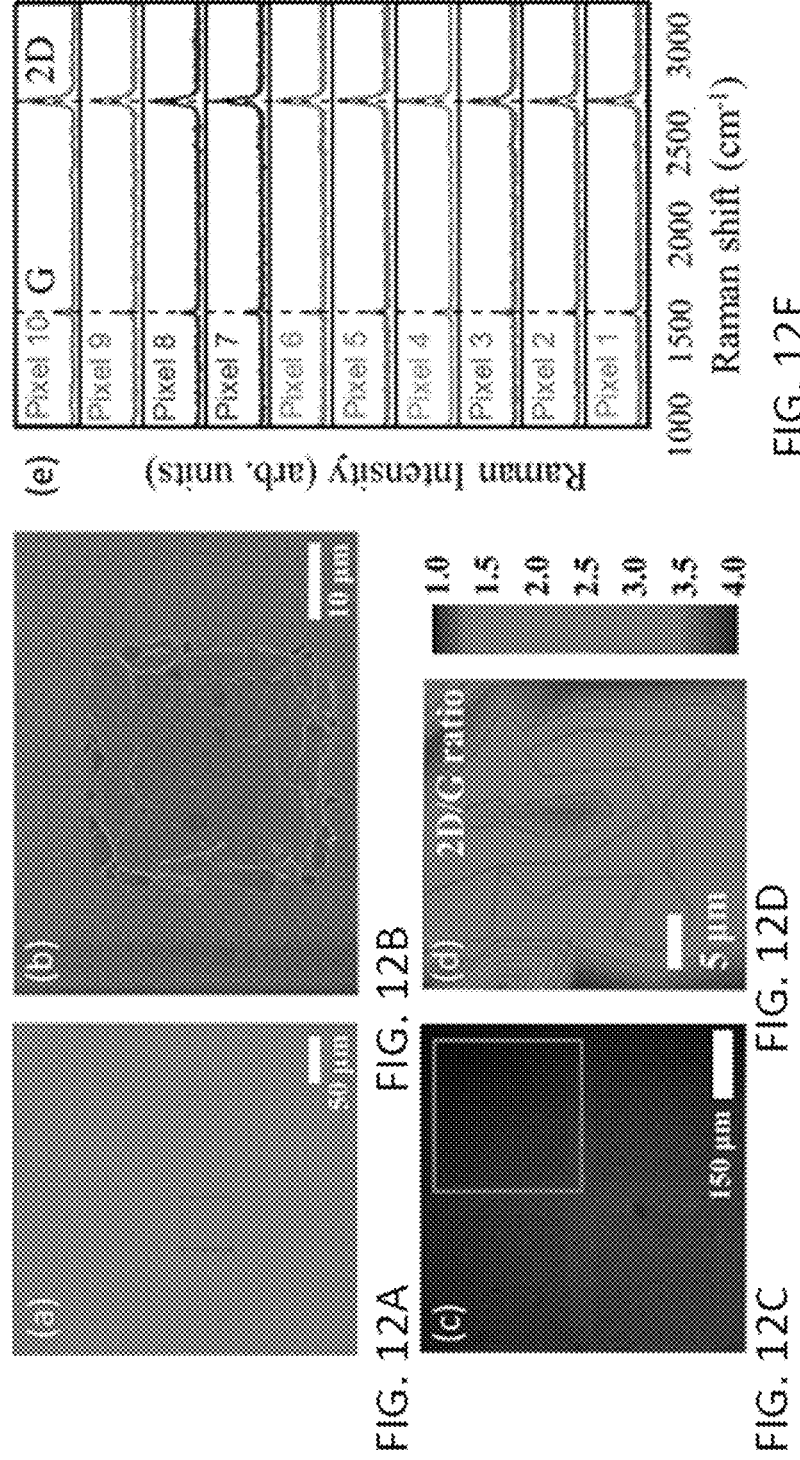
FIG. 12A illustrates an optical microscopy photograph of an array of laser printed graphene pixels onto a $SiO_2$/Si substrate, in accordance with one or more embodiments of the disclosure.
FIG. 12B illustrates an SEM image of a single graphene pixel, in accordance with one or more embodiments of the disclosure.
FIG. 12C illustrates an optical microscopy image of four graphene arrays printed onto PDMS, in accordance with one or more embodiments of the disclosure.
FIG. 12D is a Raman color map for a I2D/IG peak intensity ratio, reconstructed using 30 Raman measurements obtained from a single graphene pixel transferred on $SiO_2$/Si, in accordance with one or more embodiments of the disclosure.
FIG. 12E is a graph illustrating Raman spectra from 10 distinct graphene pixels LIFT-printed on $SiO_2$/Si, in accordance with one or more embodiments of the disclosure.

Further evidence in of well-organized transfer is provided by the SEM image shown in FIG. 12B of a single graphene pixel of the array and in an optical microscopy image (FIG. 12C) of four graphene arrays printed onto PDMS and comprising 10×10 pixels each. In addition, detailed characterization with Raman spectroscopy, as shown in FIG. 12E, confirms the high quality and monolayer form of these pixels. As is known, the presence and relative intensities of the characteristic D, G and 2D peaks of graphene in Raman spectra can give a quantitative account for the number of layers and the concentration of defects in graphene samples. Specifically, the peak intensity ratio of the 2D over the G peak (e.g., for single layer graphene us usually greater than two) gives a simple and direct means to determine the number of graphene layers, while the D peak, a defect-induced peak, provides information related to the presence or absence of defects. FIG. 12D shows the Raman color map for the I2D/IG peak intensity ratio, reconstructed using 30 Raman measurements obtained from a single graphene pixel transferred on SiO$_2$/Si (30 μm×30 μm). The average peak intensity ratio of the 2D over the G peak is calculated at 3.24±0.57 in accordance with the ratio values (e.g., 3.57±0.42) of the substrate of the reference donor (e.g., quartz/Ni/graphene). The average G peak position is at 1588.30±1.44 cm−1 and has a full width at half maximum (FWHM) of 12.25±1.62 cm−1, while the average 2D peak position and FWHM are, respectively, 2689.77±1.65 cm−1 and 27.56±1.60 cm−1.

To investigate the reproducibility of the laser printing process, in terms of graphene uniformity as well as the layer structure and morphology among 100 LIFT printed graphene pixels (30 μm×30 μm in size each), we employed micro-Raman spectroscopy. FIG. 12E presents Raman spectra from 10 distinct graphene pixels LIFT-printed on SiO$_2$/Si, and each spectrum corresponds to a single measurement taken from one random point within each pixel. In this case, the ratio comprising the average intensities of the 2D over the G peak is 3.00±0.31. The G (2D) peak has an average position at 1590.86±0.92 cm−1 (2692.01±1.01 cm−1) and a FWHM of 13.00±1.14 cm−1 (29.60±1.17 cm−1). The absence of the defect-induced D peak (1350 cm−1) indicates that no noticeable defects are introduced during the laser transfer process.

What is especially important for any technological application and for upscaling of the technique is the fact that these advantageous Raman results are common to all 10 different pixels offering clear evidence that LIFT-induced deposition of graphene can be highly controllable and reproducible. The small deviation in the G and 2D peak positions between the average values from the different pixels lies within the range of fluctuations and due to unintentional electron or hole doping. The Raman color map in FIG. 12D demonstrates uniform monolayer graphene coverage of the SiO$_2$/Si substrate after LIFT transfer, which has been confirmed through Atomic Force Microscopy (AFM) measurements, which were obtained under tapping mode operation and gave an average thickness of 0.4 nm for the laser printed graphene features.

Apart from transferring onto a SiO$_2$/Si substrate, the process may also be used to transfer graphene pixels onto a flexible substrate, namely PDMS. FIG. 12C displays four arrays of transferred graphene on PDMS. Each array comprises 100 graphene pixels and covers an area of approximately 300 μm×300 μm (0.6 mm×0.6 mm in total for the four arrays). Therefore, the LIFT technique is suitable not only for transferring graphene with high resolution but also for the coverage of larger-millimeter-sizes areas with single layer graphene patterns. The compatibility with PDMS also demonstrates that the process can be combined with temperature sensitive substrates which are important in printed electronics applications.

The process can be applied to the fabrication of touch sensitive 2D materials, or sensing systems that rely on 2D materials, such as touch sensors in a parallel plate capacitor configuration. An example design has been implemented and tested in terms of capacitive performance. The design of the touch sensor consisted of graphene arrays both as top and bottom sensing electrodes. The sensing electrodes were interconnected to pads using metal nanoparticles deposited by LIFT and laser sintered so as to form interconnections with the graphene arrays. A dielectric layer resides between the top and the bottom electrode. The top electrode is deposited onto the dielectric layer and in the same vertical line with the pad of the bottom electrode.

Manufacturing of the touch sensor also includes coating the dielectric of the parallel plate capacitor. In this case, the dielectric must partially cover the bottom electrodes, so as to keep the one side of the pads exposed for measurements using probes. For the dielectric layer, PDMS was used owing to the viscoelastic nature of the compound, which offers versatility in form factors, as well as high degradation temperature and excellent adhesion properties with both Si and flexible substrates. The resulting thickness of the PDMS layer was 3.5 μm. The deposition of graphene onto the top electrode was carried out using LIFT. In a different configuration, both the top electrode (e.g., to be coated with graphene) and the dielectric layer (e.g., to be coated with multilayer hBN) are deposited at a single step using LIFT. Through this approach, 2D capacitors with super capacitive performance owing to the ultra-thin hBN layer are antici- pated. The resulting capacitance will then be limited only by the area of the capacitor plates and the self-capacitance of graphene.

In both configurations and in order to create a compact and homogenous top electrode plate, a 30×30 array with the graphene square spots size at around 40 µm×40 µm was implemented via LIFT. This process was conducted using a laser set-up comprising a ns pulsed laser (Litron ND:YAG, 1064, 532, 355, 266 nm) with a micromachining worksta- tion. For the realization of the LIFT experiments, the donor and receiver substrates were placed in a custom-made vacuum chamber. After the formation of the bottom elec- trodes with laser transfer of silver nanoparticle (np) ink, laser sintering was carried out. Following the laser sintering of the samples, electrical characterization was performed to measure the electrical resistance. The geometrical charac- teristics of the bottom electrodes were measured to calculate the electrical resistivity of the samples. Four-point probe I-V measurements of the laser transferred graphene pixels were performed for calculating the sheet resistance. The four probes were placed collinear and equally spaced. The mea- sured substrate comprised a reference sample that included a graphene array on a flexible dielectric on rigid substrate (e.g., PDMS on Au/Si) with lateral distance of 1 mm. The calculated sheet resistance was 282.7 $\Omega$/sq. On the same sample, Capacitance over Voltage (C-V) measurements delivered an average capacitance of 2.40±0.56 pF were measured (using a two-point probe station). Furthermore, capacitance measurements were performed for laser trans- ferred graphene arrays on flexible substrates PDMS/Ag and NPs/PET, and the resulting experimental average capaci- tance value was 2.3±2 pF. For a capacitor plate area at 1000 µm×1000 µm with a thickness of the dielectric layer (PDMS) at 3 um and a dielectric constant of PDMS of 2.69, the computed capacitance value is 7.96 pF.

Figure 13:
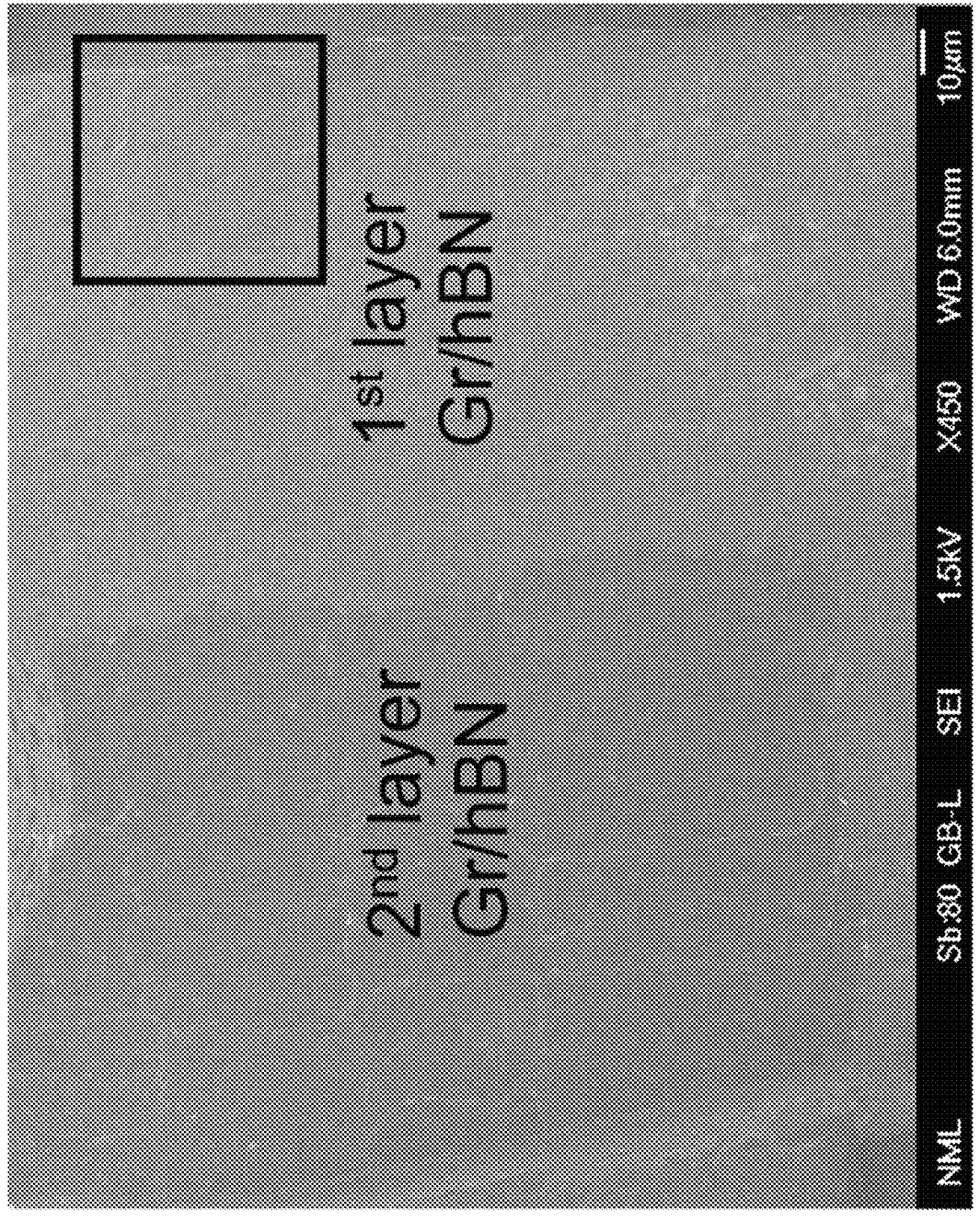
FIG. 13 is an SEM image depicting a Graphene/hBN heterostructure laser transferred over an existing laser transferred Graphene/hBN heterostructure on a $SiO_2$/Si substrate.

An additional configuration involving Graphene/hBN het- erostructures stacked on top of each other in a controllable manner has been demonstrated. The stack consists of two heterostructures transferred using LIFT in order to form parallel plate capacitors in series. Capacitors connected in series or in parallel enable a plethora of applications, for which having precise control over the total capacitance value is of major importance. In the SEM image of FIG. 13, a such fabricated structure consisting of a Graphene/hBN bilayer stacked on top of a second Graphene hBN layer is depicted, in accordance with one or more embodiments of the disclosure. The dual heterostructure has been transferred on SiO$_2$/Si. The dimensions of the top heterostructure are Graphene/hBN and consist of an array of 4×4 Graphene/ hBN pixels, while the second heterostructure has a larger surface area of Graphene/hBN consisting of an array of 6×6 pixels. The top heterostructure has smaller area in order to expose part of the bottom heterostructure and facilitate the electrical measurements. The second layer can be printed centered over the first layer, or can have an offset with respect to the first with micrometric resolution.

To evaluate the operation of the touch sensor, the sensor was subjected to stability testing, for which the touch sensor demonstrated stable performance for 200 testing cycles. The setup for capacitance measurements of the touch sensor was based on a two-electrode configuration with 3.3V of sup- plying voltage at 700 kHz frequency. Chargers were induced in the touch sensor by applying pressure either by a finger or a touch pen with diameter of 60 µm. When the finger approached the sensor surface, a capacitance of 0.8 pF was measured with a response time of 40 ms. The touch sensor was able to recover to its initial capacitance value after removing the applied pressure. Environmental conditions during testing were 23 C.° and 30% humidity.

Those skilled in the art will recognize that a wide variety of modifications, alterations, and combinations can be made with respect to the above-described embodiments without departing from the spirit and scope of the invention, and that such modifications, alterations, and combinations are to be viewed as being within the ambit of the inventive concept.

The previous description is presented to enable one of ordinary skill in the art to make and use the invention as provided in the context of a particular application and its requirements. Various modifications to the described embodiments will be apparent to those with skill in the art, and the general principles defined herein may be applied to other embodiments. Additionally, phrases that disclose the addition of one component to another component are not limiting to the sequence or placement of one component to another component. For example, the addition of component A to component B may have the same meaning as the addition of component B to component A (e.g., the two components are mixed together). Therefore, the present invention is not intended to be limited to the particular embodiments shown and described, but is to be accorded the widest scope consistent with the principles and novel fea- tures herein disclosed.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

It is further contemplated that each of the embodiments of the method described above may include any other step(s) of any other method(s) described herein. In addition, each of the embodiments of the method described above may be performed by any of the systems described herein.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effec- tively "associated" such that the desired functionality is achieved. Hence, any two components herein combined to achieve a particular functionality can be seen as "associated with" each other such that the desired functionality is achieved, irrespective of architectures or intermedial com- ponents. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly inter- actable and/or wirelessly interacting components and/or logically interacting and/or logically interactable compo- nents.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

What is claimed:

1. A method comprising:

providing a receiver substrate;

providing a donor substrate, wherein the donor substrate comprises a back surface and a front surface;

applying a coating to the front surface, wherein the coating includes donor material comprising 2D material, wherein the 2D material comprises $Bi_2Se_{(3-x)}S_x$;

aligning the front surface of the donor substrate to be parallel to and facing the receiver substrate, wherein the donor material is disposed adjacent to a target layer on the receiver substrate;

irradiating the coating through the back surface of the donor substrate with one or more laser pulses to transfer the 2D material to the target layer as a pixel;

scanning the donor substrate through a focal point of a laser while irradiating the donor material with the laser to continuously provide new donor material to transfer to the receiver substrate; and scanning the receiver substrate while irradiating the donor material with the laser to form a selected pattern of the donor material on the target layer.

2. The method of claim 1, wherein the 2D material comprises graphene, wherein the donor material on the target layer forms a portion of at least one of a top electrode or a bottom electrode of a sensor, wherein the sensor includes a dielectric layer comprising hexagonal boron nitride (h-BN) between the top electrode and the bottom electrode.

3. The method of claim 1, further comprising generating a pressure inside a vacuum chamber between, 100 kPa and 1 Pa, wherein irradiating the coating through the back surface of the donor substrate with the one or more laser pulses to transfer only the 2D material to the target layer comprises:

irradiating the coating through the back surface of the donor substrate with the one or more laser pulses to transfer only the 2D material to the target layer within the vacuum chamber.

4. The method of claim 1, wherein the 2D material comprises graphene.

5. The method of claim 1, wherein the donor material comprises conductive ink.

6. The method of claim 1, wherein the applying the coating comprises:

applying a dynamic release layer to the front surface of the donor substrate; and applying the donor material to the dynamic release layer.

7. The method of claim 1, wherein the receiver substrate comprises a Field Effect Transistor.

8. The method of claim 7, wherein the receiver substrate comprises a graphene-coated Field Effect Transistor.

9. The method of claim 1, wherein the donor material comprises a heterostructure, wherein the heterostructure comprises two or more layers of different 2D materials.

10. The method of claim 9, wherein the heterostructure comprises graphene and hexagonal boron nitride.

* * * * *